(12) United States Patent
Xie et al.

(10) Patent No.: US 7,141,502 B1
(45) Date of Patent: Nov. 28, 2006

(54) SLURRY-LESS POLISHING FOR REMOVAL OF EXCESS INTERCONNECT MATERIAL DURING FABRICATION OF A SILICON INTEGRATED CIRCUIT

(75) Inventors: James J. Xie, San Jose, CA (US); Kashmir S. Sahota, Fremont, CA (US); Richard J. Huang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 60 days.

(21) Appl. No.: 10/673,597

(22) Filed: Sep. 29, 2003

(51) Int. Cl.
*H01L 21/302* (2006.01)
*H01L 21/461* (2006.01)

(52) U.S. Cl. ............ 438/692; 438/691; 438/693; 257/E21.304; 257/E21.576

(58) Field of Classification Search ......... 438/692, 438/709, 689, 113, 86, 16, 691, 693; 257/E21.304, 257/E21.576, E21.583, E21.585
See application file for complete search history.

(56) References Cited

U.S. PATENT DOCUMENTS

| | | | |
|---|---|---|---|
| 5,441,598 A * | 8/1995 | Yu et al. | 438/692 |
| 6,638,145 B1 * | 10/2003 | Hall et al. | 451/41 |
| 6,709,981 B1 * | 3/2004 | Grabbe et al. | 438/692 |
| 7,041,599 B1 * | 5/2006 | Li et al. | 438/692 |
| 2002/0052064 A1 * | 5/2002 | Grabbe et al. | 438/113 |
| 2003/0109200 A1 * | 6/2003 | Hall et al. | 451/41 |
| 2003/0162399 A1 * | 8/2003 | Singh | 438/692 |
| 2003/0207582 A1 * | 11/2003 | Twu et al. | 438/709 |
| 2004/0058546 A1 * | 3/2004 | Hall | 438/692 |
| 2004/0229461 A1 * | 11/2004 | Darsillo et al. | 438/689 |

\* cited by examiner

*Primary Examiner*—Walter Lindsay, Jr.
(74) *Attorney, Agent, or Firm*—Farjami & Farjami LLP

(57) ABSTRACT

A method for Chemical-Mechanical Polishing utilizes a two step process. The first step utilizes a slurry with abrasive particles which become embedded into a conditioned polishing pad having small cavities in the surface. During the second step the slurry flow is discontinued and the final polishing is performed using the embedded small abrasive particles. Using this method dishing has been reduced considerably, and has enabled the fabrication of a Damascene metal gate NMOSFET fabricated with Atomic Layer Deposition (ALD).

8 Claims, 5 Drawing Sheets

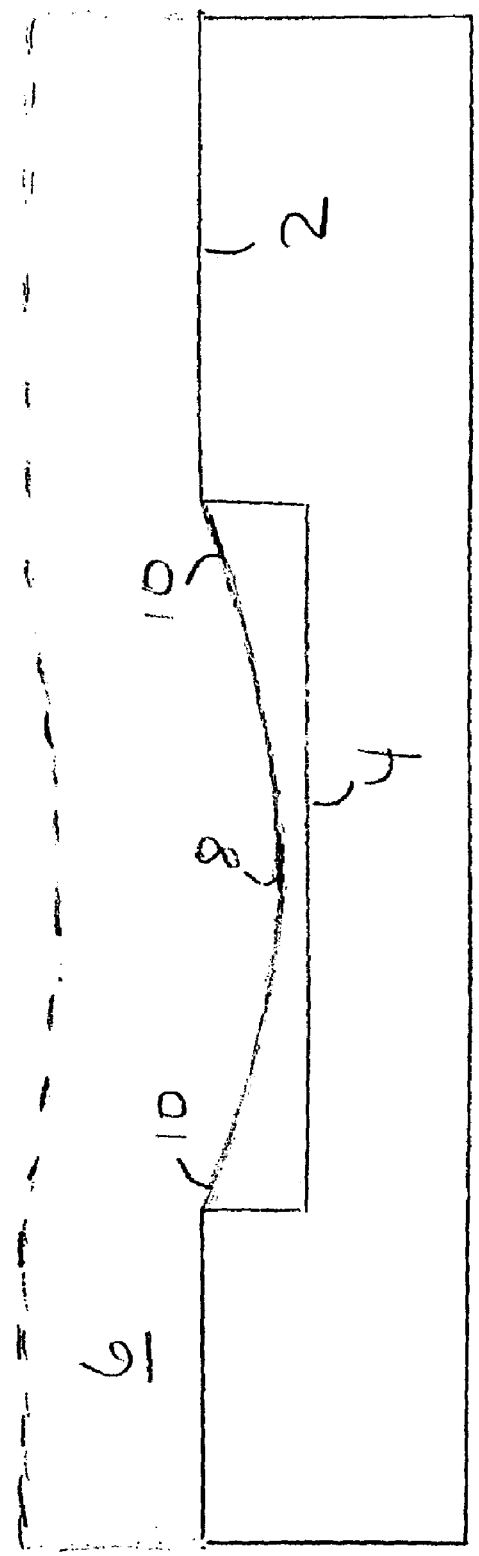

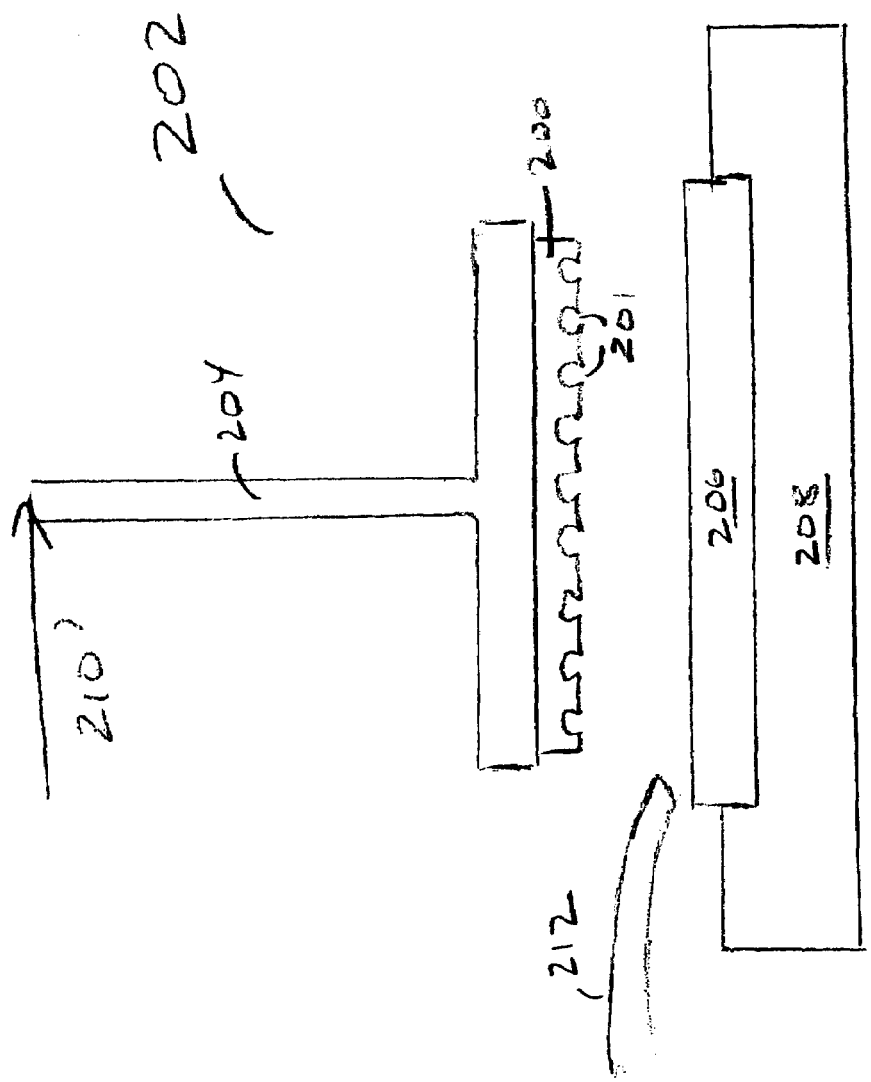

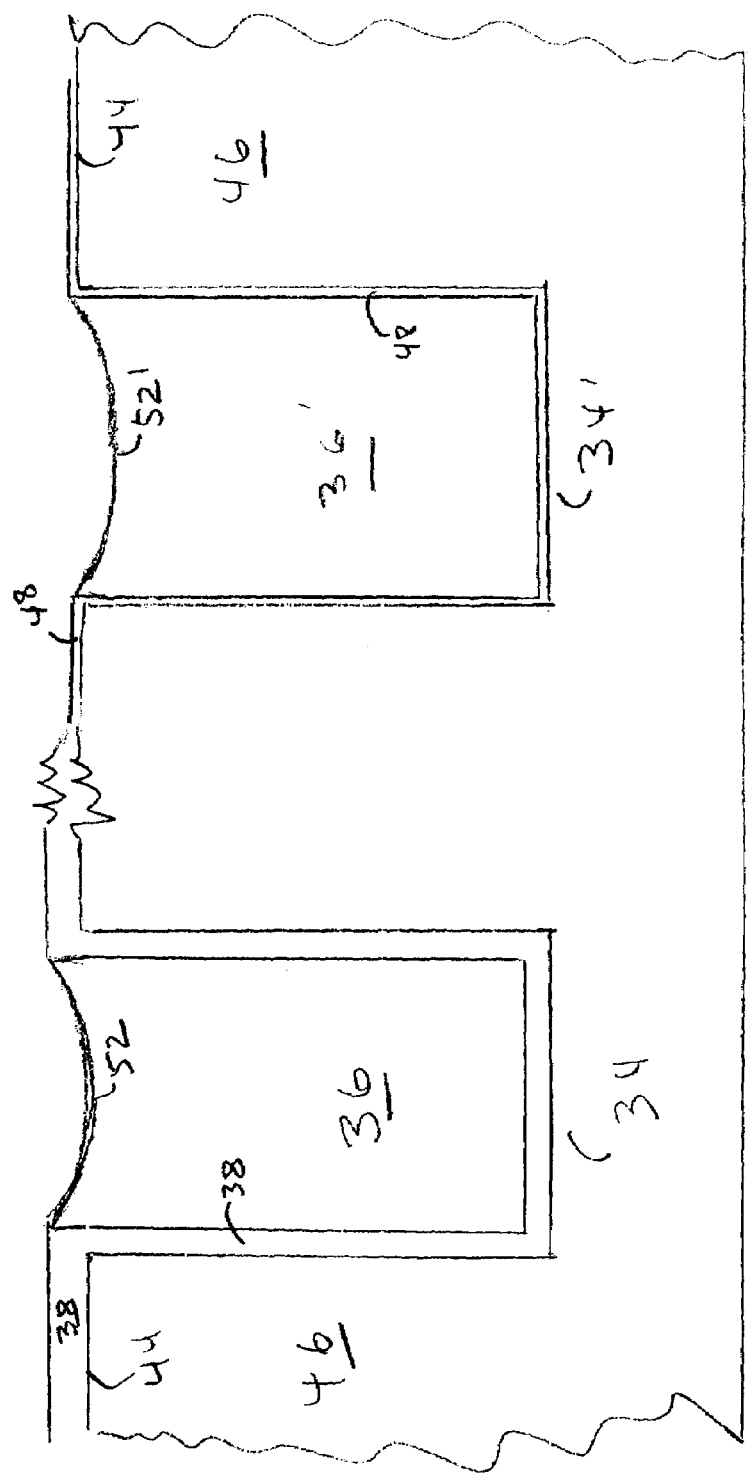

SLURRY-LESS POLISHING FOR REMOVAL OF EXCESS INTERCONNECT MATERIAL DURING FABRICATION OF A SILICON INTEGRATED CIRCUIT

FIELD OF THE INVENTION

This invention relates to Chemical-Mechanical Polishing (CMP) and more particularly to the embedding of abrasive into polishing pads to reduce dishing and improve uniformity of polish.

BACKGROUND OF THE INVENTION

As integrated circuit devices shrink, and as circuit speed and performance increase, copper has replaced aluminum as the preferred electrical interconnect material. The use of copper as an interconnect material in silicon integrated circuits has occurred in response to the need for lowered interconnect resistivity, good electromigration resistance, and good deposition characteristics which allow effective filling of vias and contacts.

Copper metallization structures are often formed by a process known as Damascene, wherein an interlevel dielectric layer (ILD) has regions etched therein into which metal lines will be inlaid. A barrier layer is deposited, which serves to prevent diffusion of copper from the metal lines into the dielectric. This barrier layer is generally comprised of Ta or Ta compounds. A copper seed layer is then generally deposited, followed by an electroplated copper layer. The excess copper is then removed by a process known as Chemical Mechanical Polishing (CMP). CMP enhances the removal of surface material over large distances and short distances by simultaneously abrading the surface while a chemical etchant selectively attacks the surface. For this purpose, CMP typically utilizes a polishing slurry containing both an abrasive and a chemically active component.

A problem in standard prior art CMP, particularly during the overpolishing necessary to remove all the metal (or other material being polished) from the surface, is known as recession or dishing, which is illustrated in FIG. 1. Uneven wafer surface 2 has recessed region 4. Deposited layer 6 is polished off of the surface, but in the center 8 of region 4, the surface of the polished deposited layer 6 is at a lower level than at the edge 10 of region 4. The dishing effect is more serious for wide shallow recessed regions than for narrow deep recessed regions.

A prior art method for reducing dishing during CMP overpolish is the fixed-abrasive method, whereby abrasive particles are suspended in a stationary medium on the pad rather than being incorporated into the slurry. The free-floating abrasive particles which are the primary cause for dishing are not present using this method. Fixed-abrasive CMP is described by E. Korczynski in *"A Level Future"*, *Semiconductor Magazine*, Vol. 3, No. 7, July 2002.

Fixed-abrasive CMP has its own associated set of problems. The fixed-abrasive CMP system's polishing pads are generally 5–10 times more costly than standard polishing pads. Additionally, there is a balancing act between throughput and low density of scratches: in order to achieve a high polishing rate, the fixed abrasive particles cause appreciable scratching. Also, there may be some residual dishing due to large abrasive particle size. Finally, the fixed abrasive pad will degrade during use, which leads to variable polish rates and amount of micro-scratches.

A CMP method for polishing metals such as copper that reduces dishing effects and achieves a high polish rate and low density of defects and scratches would be an important improvement in CMP technology.

SUMMARY OF THE INVENTION

It is therefore an object of this invention to provide an improved method for chemical-mechanical polishing which achieves highly planar topography on large pattern features.

It is a further object of this invention to provide an improved method for chemical-mechanical polishing which reduces dishing and minimizes final surface microscratching.

It is a still further object of this invention to provide an improved method for chemical-mechanical polishing which utilizes a renewable polishing pad.

These objects are met by employing a pad having a surface which will permit a fine abrasive to become embedded therein during a first polishing phase, and using a second slurry-less phase during the final portion of the polishing process, employing the same pad with the embedded fine abrasive.

BRIEF DESCRIPTION OF THE DRAWINGS

FIG. 1 illustrates the dishing effect.
FIG. 2b illustrates the CMP apparatus.
FIG. 4 illustrates the dishing problem as evidenced in formation of replacement metal gates using ALD barrier.

DETAILED DESCRIPTION OF THE INVENTION

Our inventive process includes a two phase polish, the first of which utilizes a slurry, and the second of which is slurry-less. During the first phase utilizing slurry, fine abrasive particles are embedded into the polishing pad. During the second slurry-less phase, the fine embedded particles and the chemicals adsorbed/absorbed into the pad provide a very uniform final polish with much reduced dishing.

Figure 2A:
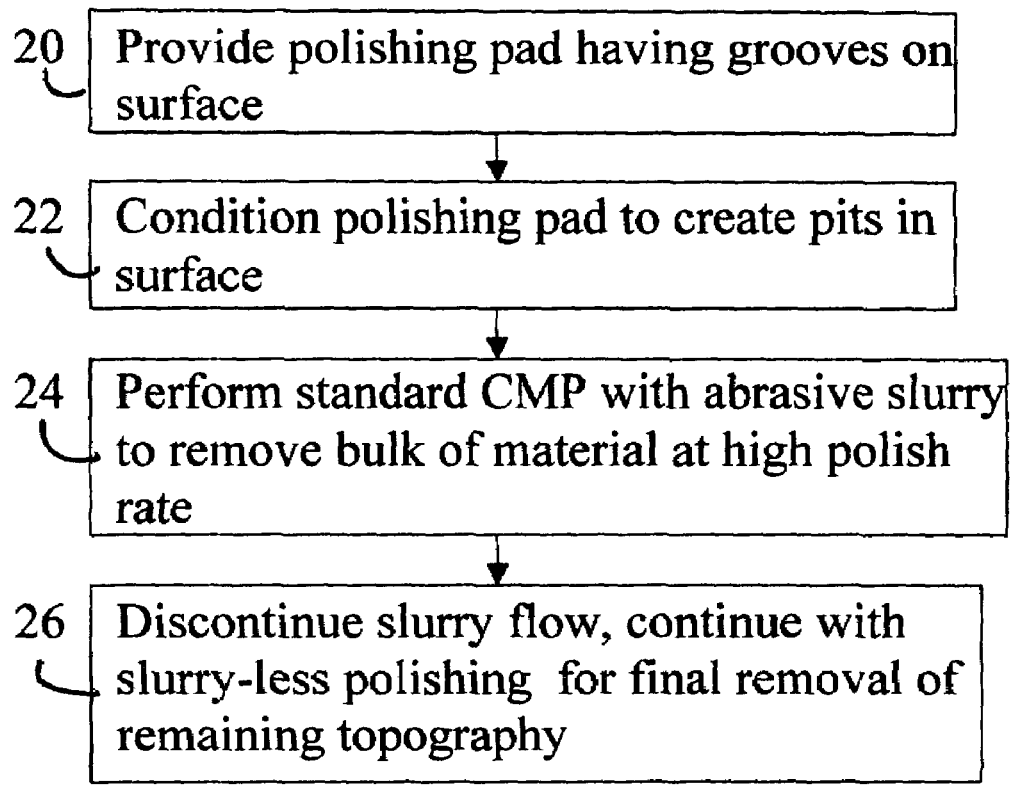
FIG. 2a shows the process flow of the inventive method.

The process flow is shown in FIG. 2a and illustrated in FIG. 2b.

In step 20, a polyurethane polishing pad 200 having grooves on the polishing surface is provided. The IC1000 pad, commercially available from Rodel, Inc., having k-grooves, is a preferred alternative. Pads with other shaped grooves would also be acceptable. In fact, if step 22 is extended, pads without grooves will also be an alternative.

In step 22, the polishing pad is conditioned, by way of example by using a #20–200 grit diamond disc, to create and/or sustain a large number of pits or cavities (pores) 201 of 10–100 micron diameter in the polishing surface of the pad. 10–40% or more of the pad surface area may be comprised of pores. These pits/pores will serve as receptacles for embedded abrasive particles. Alternatively, creation or modification of pores may occur during the polyurethane fuming process as the pore precursor burns out. The conditioning may be performed ex-situ or in-situ in the CMP polisher, as determined to achieve a consistent process. The use of a pad having proper amount of open pore porosity may eliminate the need for pits or pad conditioning.

In step 24, in phase one a standard CMP is performed in a polisher 202, wherein a polishing head 204 holds the conditioned polishing pad against the sample 206 which is mounted on a sample holder 208, and a motion inducer 210 moves, generally rotates, the polishing pad across the sample. During this first CMP step slurry containing abrasive particles is flowed by a dispenser 212 onto the sample, for a long enough period to remove the bulk of the material to be polished away at a high polish rate. During the process of this step, a portion of the fine abrasive particles from the slurry become embedded into the pits of the pad which were formed in step 22. Additionally, during this step, some of the active chemicals present in the slurry are soaked into the pad. The topography of the pattern features, i.e., the step heights, are typically reduced to approximately 50–200 nm during this step, which is close to the size of the larger agglomerated abrasive particles in standard slurry solutions. The smaller sized, finer abrasive particles tend to sift downward towards the pad where they may become embedded into the pad grooves, while larger particles tend to be excluded naturally, and washed away along with excess slurry fluid.

In step 26, slurry flow is discontinued, and slurry-less polishing is utilized for final removal of the remaining topography and for any necessary overpolish, typically reducing step heights to 5–50 nm. Since neither the chemicals or the abrasives are present at the sample surface except at points of direct physical contact with the polishing pad, there is no accumulation of slurry particles or continuous oxidation, and dishing is greatly reduced. It is also believed that as abrasive particles are used in the polishing process for a period of time (instead of being continuously replaced by fresh particles), their surfaces may be modified to result in a less aggressive polish. This may also contribute to the lowered dishing.

Endpoint sensing detection can be employed to determine the start time for commencing this final polishing phase, particularly for metal CMP of such materials as Cu, Al, Ta, and W, since there is a transition from opaque to semi-transparent in the optical reflectivity signal as the metal thickness reaches a value of about 50–100 nm.

Subsequent wafers can be polished with the same pad, which will be regenerated and replenished with additional embedded fine abrasive particles and additional chemicals during the first polishing phase where slurry flow is resumed. This inventive process is thereby self-sustaining, and maintains relatively stable polish rates and density of micro-scratches. Cost and reproducibility factors are thereby greatly improved relative to prior-art fixed-abrasive pad methods. Dishing is reduced to levels substantially as low as those achieved with fixed-abrasive pads.

Figure 3:
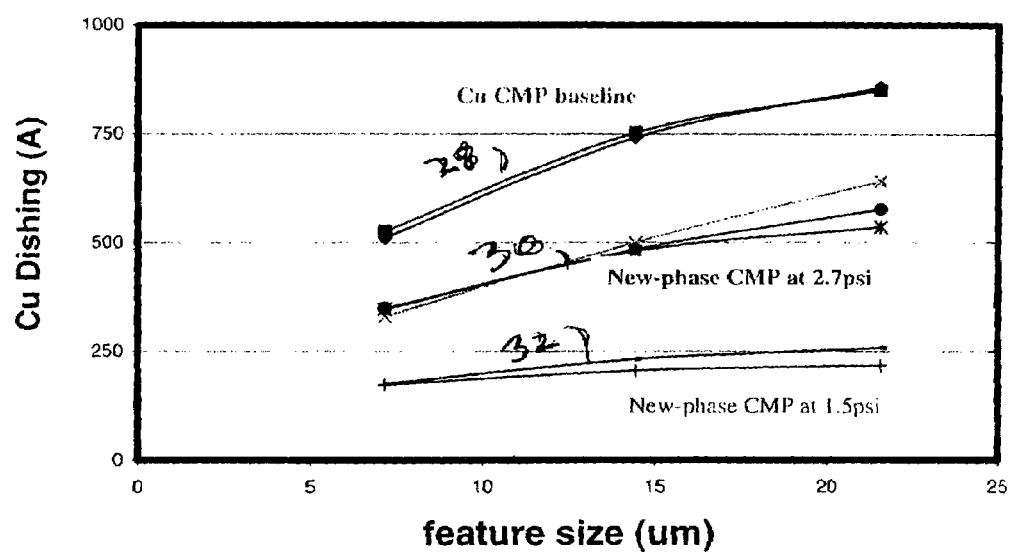
FIG. 3 is a graph of dishing vs. feature size, for standard CMP compared with the inventive method.

FIG. 3 is a graph of dishing as a function of feature size, for prior art standard CMP methods (curves 28) compared with the inventive embedded-abrasive method, shown at 2.7 psi (curves 30) and 1.5 psi (curves 32) pad pressures. The data shown was taken from a single Damascene structure including a single Cu line atop silicon nitride, embedded in TEOS dielectric. The same equipment and source were used for all three curves. The slurry used to obtain this data was copper slurry DP 106 from DuPont, a fumed silica abrasive slurry which is believed to contain abrasive particles with diameters in the range between 10 nm and 500 nm.

The inventive method used at 2.7 psi pad pressure results in approximately 30% reduction in dishing loss as compared to standard CMP, and the inventive method used at 1.5 psi pad pressure results in approximately 60% reduction in dishing loss as compared to standard CMP. Choice of pad pressure values is determined by balancing dishing loss and throughput considerations, since lower pad pressure results in lower polish rate. Another factor in the choice of pad pressure is the acceptable number of microscratches, which is approximately proportional to pad pressure.

The inventive method has been applied to the fabrication of a Cu/ALD TaN metal gate. This process has been described in "*Replacement Metal-Gate NMOSFET's with ALD TaN/EP-Cu, PVD Ta, and PVD TaN Electrode*" by James Pan et al, IEEE Electron Device Letters, May 2003, Vol. 24, No. 5, pp. 304–305. A replacement (Damascene) metal gate NMOSFET has been fabricated with [Atomic Layer Deposition (ALD) TaN]/[PVD and electroplated Cu] as the stacked gate electrode. This type of gate and configuration has the advantages of reduced gate resistivity, and reduced stress and radiation damage to the gate oxide, as well as maintaining the low temperatures critical for metal gate and high k materials.

One major difficulty in prior attempts to fabricate such a device has been dishing during copper CMP. This problem is illustrated in FIG. 4, depicting a first trench 34 filled with copper 36, and a second trench 34' filled with copper 36'. In both cases excess copper has been removed by standard CMP. In first trench 34, standard barrier layer 38 which may be comprised of about 250 Angstroms Ta is formed on bottom 40 and sidewalls 42 of trench 34, as well as on top surface 44 of dielectric 46. In second trench 34', ALD barrier layer 48, (which may be comprised of Ta), having approximate thickness of 1 monolayer, about 5–50 Angstroms, replaces barrier layer 38. Both copper 36 and copper 36' evidence the same amount of dishing 50. However, note that the bottom 52 of dished region in copper 36 is approximately at the level of top surface 44 of dielectric 46, whereas the bottom 52' of dished region in copper 36 is considerably recessed below top surface 44 of dielectric 46. When barrier layers 38 and 48 are removed from atop dielectric 46, copper 36 will not be significantly recessed, whereas copper 36' will be significantly recessed. In the ALD replacement metal gate transistor, the dishing is so pronounced in such large area regions as the probing pads, that the metal is eroded away so as to make the device inoperative.

The method of the present invention has been used to perform CMP on the structure of FIG. 4, yielding considerably reduced dishing and therefore substantially less recession in the copper 36'. Using this method, the first successful replacement (Damascene) metal gate NMOSFET has been fabricated with Atomic Layer Deposition (ALD).

It is believed that the present invention will be applicable to Cu/SiCOH, Cu/(Ultra Low K dielectric), known as Cu/ULK, and 65 nm node technologies. For example, the minimum dishing/erosion achieved using the method of the present invention corresponds to the minimum requirement for removing the oxide cap on ULK dielectric layers without exposing the ULK material or incurring metal bridging for the next metal level (building up with multiple metal layer integration).

It is not intended that the invention be restricted to the exact embodiments described herein. It should be apparent to those skilled in the art that changes and modifications may be made without departing from the spirit of the invention. For example, various types of new polyurethane pads with open pore cell structures are suitable for embedding various abrasives, such as fumed or colloidal silica, alumina, ceria, or their hybrid mixtures. Closed pore pads may also be usable. It is also possible to selectively create certain pitches of pores on the polishing pad so as to enable the pad to selectively filter out larger abrasive particles while retaining the finer abrasive particles in the polishing pad. It is also believed that greatly reducing the slurry flow will provide at least a substantial portion of the benefit of completely stopping the slurry flow.

The scope of the invention should be construed in view of the claims.

We claim:

1. A silicon integrated circuit fabricated using a method of removing excess interconnect material during fabrication of said silicon integrated circuit, said method of removing comprising the steps of:

dispensing a slurry including abrasive particles and chemical on a sample having said excess interconnect material;

polishing said sample with said slurry, using a polishing pad having a plurality of pits, to remove said excess interconnect material, wherein said abrasive particles and chemical become embedded into said plurality of pits of said polishing pad;

reducing said dispensing of said slurry after said polishing for a first period of time, wherein said dispensing of said slurry is reduced to a stop, said step of reducing occurring after detecting an endpoint of said step of polishing said sample with said slurry, based on a thickness of said excess interconnect material; and polishing said sample using said polishing pad for a second period of time to remove said excess interconnect material.

2. The silicon integrated circuit of claim 1, wherein said silicon integrated circuit includes a metal gate fabricated with Atomic Layer Deposition (ALD) and said excess interconnect material is copper.

3. The silicon integrated circuit of claim 2, wherein said ALD includes Ta.

4. The silicon integrated circuit of claim 1, wherein said thickness of said excess interconnect material is determined based on optical reflectivity.

5. The silicon integrated circuit of claim 1, said excess interconnect material is copper.

6. The silicon integrated circuit of claim 1, wherein said plurality of pits are created by abrading a polishing surface of said polishing pad with an abrasive disc.

7. The silicon integrated circuit of claim 1, wherein said steps of polishing are performed at a pressure of about 1.5 psi.

8. The silicon integrated circuit of claim 1, wherein said steps of polishing are performed at a pressure of about 2.7 psi.

* * * * *